(12) United States Patent
Johnson et al.

(10) Patent No.: US 7,655,508 B2
(45) Date of Patent: Feb. 2, 2010

(54) OVERMOLDING ENCAPSULATION PROCESS AND ENCAPSULATED ARTICLE MADE THEREFROM

(75) Inventors: Mark S. Johnson, Boise, ID (US); Todd O. Bolken, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 935 days.

(21) Appl. No.: 10/894,675

(22) Filed: Jul. 20, 2004

(65) Prior Publication Data

US 2004/0266069 A1 Dec. 30, 2004

Related U.S. Application Data

(60) Continuation of application No. 09/989,477, filed on Nov. 20, 2001, now abandoned, which is a division of application No. 09/652,076, filed on Aug. 31, 2000, now Pat. No. 6,537,853, which is a continuation-in-part of application No. 09/388,045, filed on Sep. 1, 1999, now Pat. No. 6,605,331, which is a division of application No. 09/255,554, filed on Feb. 22, 1999, now Pat. No. 6,143,581.

(51) Int. Cl.
*H01L 21/00* (2006.01)
(52) U.S. Cl. .............. 438/127; 438/112; 257/E21.503
(58) Field of Classification Search ............ 438/112, 438/127; 257/E21.503
See application file for complete search history.

(56) References Cited

U.S. PATENT DOCUMENTS

| | | | |
|---|---|---|---|
| 4,744,637 A | 5/1988 | Sekimura et al. | |
| 4,868,349 A | 9/1989 | Chia | |
| 5,070,041 A | 12/1991 | Katayama et al. | |
| 5,218,759 A * | 6/1993 | Juskey et al. | 29/840 |
| 5,258,330 A * | 11/1993 | Khandros et al. | 29/593 |
| 5,270,573 A | 12/1993 | Takayanagi et al. | |
| 5,609,889 A | 3/1997 | Weber | |
| 5,635,220 A | 6/1997 | Izumi et al. | |
| 5,679,977 A * | 10/1997 | Khandros et al. | 257/692 |
| 5,710,062 A | 1/1998 | Sawai et al. | |
| 5,766,987 A | 6/1998 | Mitchell et al. | |
| 5,853,771 A | 12/1998 | Matsumoto | |
| 5,874,324 A | 2/1999 | Osada | |
| 5,900,676 A | 5/1999 | Kweon et al. | |
| 5,915,169 A | 6/1999 | Heo | |

(Continued)

OTHER PUBLICATIONS

John H. Lau (Editor), Chip on Board Technologies for Multichip Modules; 1994, pp. 2, 3, 24-27, 30-33, 330-337; Van Nostrand Reinhold, an International Thomson Publishing Co.

(Continued)

*Primary Examiner*—Jarrett J Stark
(74) *Attorney, Agent, or Firm*—Jones Day; Edward L. Pencoske (57) ABSTRACT

A method of encapsulating an article having first and second surfaces, includes positioning the article on a carrier such that at least a portion of the first surface contacts the carrier. A portion of the carrier carrying the article is then positioned within a mold and a seal is formed between the mold and the carrier. The mold is then filled with an encapsulating material to form a seal between the article and the carrier.

18 Claims, 9 Drawing Sheets

U.S. PATENT DOCUMENTS

| | | |
|---|---|---|
| 5,950,070 A | 9/1999 | Razon et al. |
| 6,037,662 A | 3/2000 | Yoon et al. |
| 6,057,175 A | 5/2000 | Milla et al. |
| 6,241,153 B1 | 6/2001 | Tiffany, III |
| 6,294,825 B1 | 9/2001 | Bolken et al. |
| 6,498,396 B1 | 12/2002 | Arimoto |

OTHER PUBLICATIONS

John H. Lau, Shi-Wei Ricky Lee, Chip Scale Package (CSP); pp. vii-xvi, 1, 2, 43, 61, 91, 87, 97, 107, 129, 143, 157, 173, 183, 201, 219, 233, 259, 283, 293, 305, 313, 337, 349, 359, 377, 399, 407, 429, 439, 455, 467, 477, 487, 495, 519, 529, 545; McGraw-Hill Publishing Company.

* cited by examiner

OVERMOLDING ENCAPSULATION PROCESS AND ENCAPSULATED ARTICLE MADE THEREFROM

This application is a continuation of U.S. patent application Ser. No. 09/989,477 filed on Nov. 20, 2001, now abandoned which is a divisional of U.S. patent application Ser. No. 09/652,076, now U.S. Pat. No. 6,537,853 filed on Aug. 31, 2000, which is a continuation-in-part of U.S. patent application Ser. No. 09/388,045, now U.S. Pat. No. 6,605,331 filed on Sep. 1, 1999, which is a divisional of U.S. patent application Ser. No. 09/255,554, now U.S. Pat. No. 6,143,581 filed on Feb. 22, 1999.

BACKGROUND OF THE INVENTION

1. Field of the Invention

The invention relates to a method of encapsulating an article and, more specifically, to a method of overmolding an article and an overmolded encapsulated article made therefrom.

2. Description of the Background

It is well known that electronic devices are sensitive and thus require protection from physical and environmental conditions which may degrade or completely ruin them. Therefore, it is well known in the art to protect electronic devices from these conditions by sealing them with a protective encapsulation material. This "packaging" of the electronic devices protects them from the conditions which may degrade them and allows the devices to be transported and handled, and thus allows them to be easily configured with other components.

One prior-art method for encapsulating devices is the "transfer-molding" method. Transfer molding is a process through which an encapsulating material, such as a thermosetting material, is caused to flow into a cavity formed by components of a mold. The thermosetting material enters into the cavity and flows over the electronic device[s] that is[are] located within the cavity and is then "cured" so that the resin hardens into a non-flowable state. Traditionally it has been important to control the flow of the material into the cavity for a number of reasons, including: to provide void-free fill over the electrical device, to control the flow of the material so as to not contaminate unwanted areas with the encapsulating material, and to control the flow of the material so as to not cause any wire displacement or other damage to the assembly.

Also, it is well known in the art to use mechanical clamping mechanisms as sealing devices in conjunction with the molding cavity to attempt to contain the thermosetting resin within the cavity prior to curing. However, because mechanical clamps must be applied in a symmetrical fashion, i.e. equal and opposite clamping forces, the configuration of the molds is limited to symmetrical designs.

Therefore there is a need for an improved encapsulation method for transfer molding electronic devices which provides a leak proof sealing mechanism for asymmetric designs while using current equipment and known materials and techniques.

Additionally, many competing packaging technologies are available for main and cache memory chips. For example, plastic quad flat pack (PQFD), Swiss outline package (SOP), Swiss outline J-leaded (SOJ), small outline IC (SOIC), thin quad flat pack (TQFP), thin small outline package (TSOP) direct chip attachment on PCB (DCA), and chip scale package (CSP) are all available for use in connection with memory chips. Each of these types of packaging has its own unique advantages, and the selection of a packaging type is often dictated by such advantages. For example, PQFPs are considered by some as the most cost-effective packages for surface mount technology. This type of packaging is often used to house one or more cache memories. On the other hand, TSOP is a very low profile plastic package which is specifically designed to house SRAM, DRAM, and flash memory chips for space limited applications.

Although the CSP is a relatively new packaging technology, there are more than forty different CSPs reported in the literature with most uses being for SRAMs, DRAMs, and flash memory chips. CSPs are also used for application specific ICs (ASICs) and microprocessors in cases where the pin count is not too high. The unique feature of most CSPs is the use of a substrate to redistribute the very fine-pitch of the peripheral pads on the chip to a much larger pitch of the pads on the substrate. With the substrate, the CSP is easier to test at high speeds and to perform burn-in than, for example, the DCA package. Because of the standard size, another advantage of the CSP is ease of assembly or rework. The CSP also provides for physical protection of the die and is less susceptible to die shrinkage.

However, it is often desirable to mount a memory chip directly onto a board. With the CSP, the chip is already mounted to a substrate such that the ability to directly mount the chip to a board is lost. Thus, the need exists for a CSP that provides all the advantages of the CSP but without the need for a substrate.

SUMMARY OF THE INVENTION

The present invention, in its broadest form, is directed to a method of sealing an article to be encapsulated in which a first seal is created using a clamping pressure. The first seal prevents an encapsulating material from escaping from the mold. As the encapsulating material is injected into the mold, a second seal is dynamically formed by the force of the encapsulating material acting on the article being encapsulated.

The present invention also provides a method of encapsulating an article having first and second surfaces comprising, positioning the article on a carrier such that at least a portion of the first surface contacts the carrier, positioning a portion of the carrier carrying the article within a mold, forming a seal between the mold and the carrier, and filling the mold with an encapsulating material in a manner that forms a seal between the article and the carrier.

Additionally, the present invention is directed to a chip scale packaged die having no substrate. The present invention combines the advantages of chip scale packaging with the flexibility of direct board mounting. Those advantages and benefits, and others, will be apparent from the Description of the Preferred Embodiment herein below.

BRIEF DESCRIPTION OF THE DRAWINGS

For the present invention to be readily understood and practiced, the invention will now be described, for purposes of illustration and not limitation, in conjunction with the following figures wherein.

DETAILED DESCRIPTION OF A PREFERRED EMBODIMENT

Figure 1:
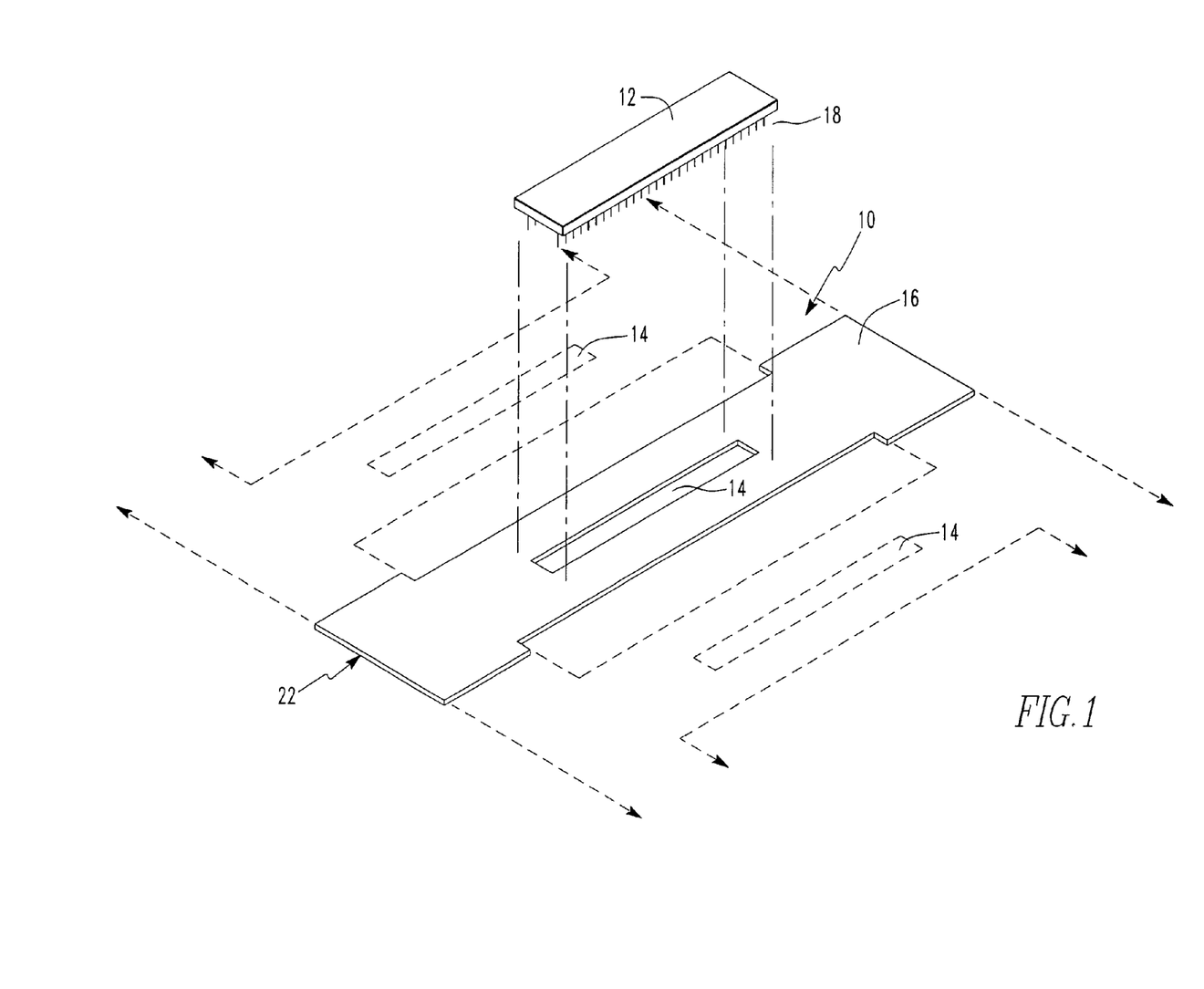
FIG. 1 illustrates a substrate which may be used in conjunction with a method of the present invention.

FIG. 1 illustrates a substrate 10 which may be used in conjunction with the method of the present invention. The description of the method of the present invention in connection with the substrate 10 is for purposes of illustration only, and not limitation. It is anticipated that the method and molds of the present invention may be used to encapsulate a large variety of articles, both electrical and non-electrical. In FIG. 1, the substrate is a known flexible substrate suitable for receiving electrical devices 12 in openings 14. The electrical device may be any type of device, although a memory device is shown in FIG. 1.

The electrical device 12 may be connected to a first side 16 of the substrate 10 by any known means, e.g. lamination, adhesion, etc. The device 12 may be of a type in which electrical connections extend from the center of the device. The device 12 is positioned such that the electrical connections 18 of the device 12 extend through opening 14 to a second side 20 of substrate 10, seen in FIG. 3. In the remaining pre-singulation figures, only portion 22 of substrate 10 is illustrated for purposes of convenience. The reader will recognize that the description of the method and molds hereinafter with respect to portion 22 is actually carried out "x" times, e.g., 8, 10, 12, etc. depending upon the size and capacity of the encapsulating equipment.

Figures 2, 3:
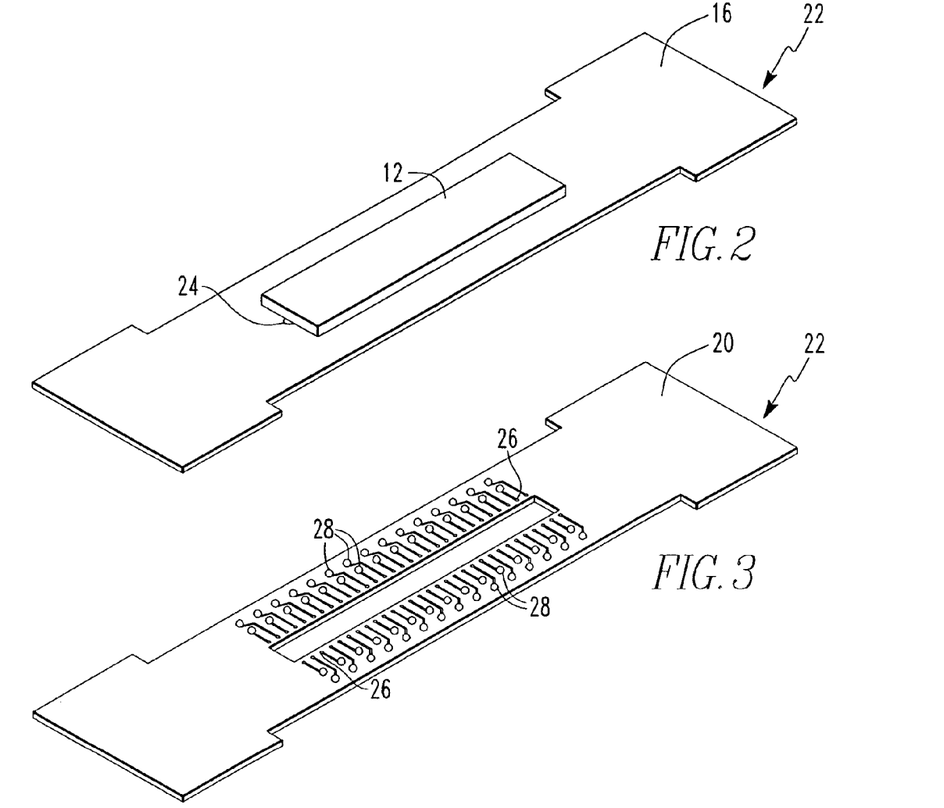
FIG. 2 illustrates a portion of the substrate of FIG. 1 carrying an electrical device to be encapsulated.
FIG. 3 illustrates the opposite side of the substrate illustrated in FIG. 2.

In FIG. 2 it is seen that the device 12 is positioned such that opening 14 is not completely blocked leaving a small opening referred to as a secondary gate 24. If the device 12 completely blocks opening 14, then an alternate means of providing encapsulating material must be provided as described below.

In FIG. 3, the second side 20 of the portion 22 of the substrate 10 is illustrated. Second side 20 has traces 26 formed therein. The traces 26 may be formed using a solder masking step as is known in the art. Solder balls 28 may be embedded in portion 22 to provide a termination/connection point for each of the traces 26. After the device 12 is connected to the portion 22 and the electrical connections 18 are extending through opening 14, each electrical connection 18 is connected to one of the traces using any known connection technique and machinery.

Figure 4:
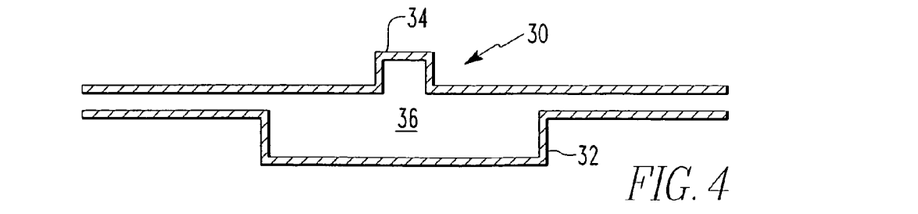
FIG. 4 illustrates first and second mold sections which define a mold cavity.

A mold 30 which may be used in conjunction with the method of the present invention is illustrated in FIG. 4. In FIG. 4, a first mold section 32 and a second mold section 34 cooperate to define a mold cavity 36.

Figure 5:
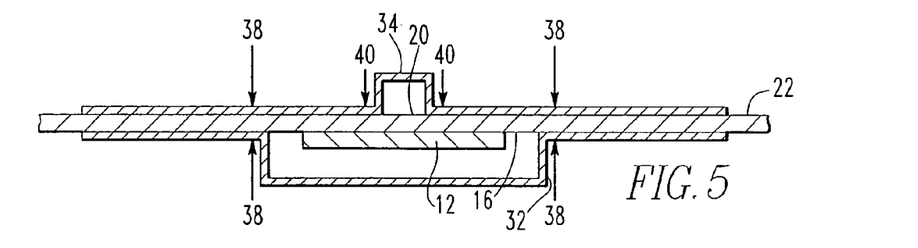
FIG. 5 illustrates the portion of the substrate shown in FIGS. 2 and 3 positioned in the mold cavity.

FIG. 5 illustrates the portion 22 positioned within cavity 36. The portion 22 is positioned such that device 12 is entirely within the portion of the cavity 36 formed by the first mold section 32, although, for other devices that may not be the case. Similarly, opening 14, and the connection of the electrical connections 18 to traces 26 is positioned entirely within the portion of the cavity 36 formed by the second mold section 34.

The asymmetry of the mold sections 32, 34 can be clearly seen in FIGS. 4 and 5. In this illustrated embodiment, the surface area of the mold section 32 is approximately three times greater than a surface area of the mold section 34. Generally, the surface area (A16) of the first side 16 of portion 22 facing mold cavity 36 must be greater than the surface area (A20) of the second side 20 of portion 22 facing mold cavity 36. That is A16>A20.

Another by-product of the asymmetry is that first mold portion 32 may be sealed against the first surface 16 of portion 22 by applying clamping pressure in the four areas marked 38. No such seal can be formed at this time between second mold portion 34 and the second surface 20 of portion 22 because no clamping pressure can be exerted in opposition to the two areas marked 40. Not shown in FIGS. 4 and 5 is a runner and primary gate, which is the mechanism for injecting the encapsulating material into the portion of the mold cavity formed by the first mold section 32.

Figure 6:
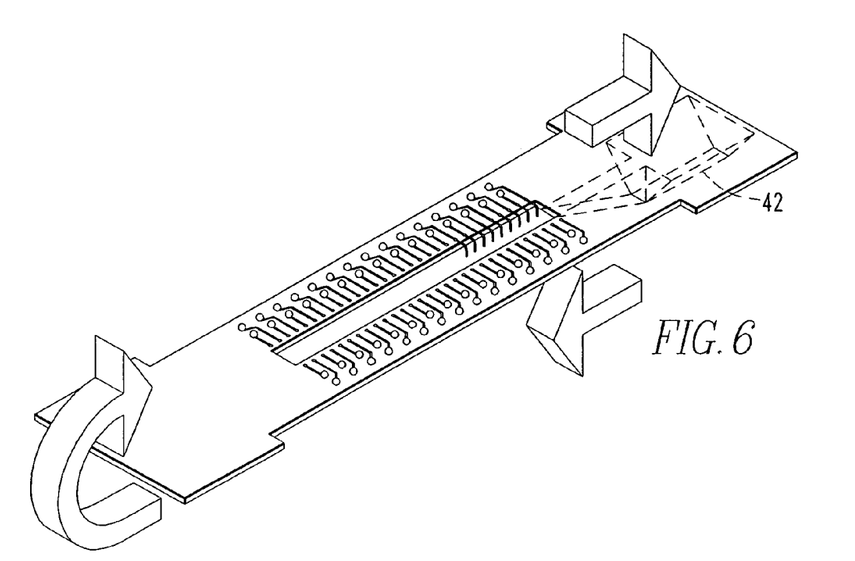
FIG. 6 illustrates a sequence of filling the mold cavity.

Turning now to FIG. 6, the sequential flow of encapsulating material into the mold cavity 34 is shown. Encapsulating material flows under pressure through runner 42 into the portion of the mold cavity formed by first mold section 32. The pressure in runner 42 is designated P1 while the pressure in the portion of the mold cavity formed by first mold section 32 is designated P2. The encapsulating material passes through secondary gate 24 at a pressure of P3 and into the portion of the mold cavity formed by second mold section 34 at a pressure of P4. The pressure is controlled such that P1>P2>P3>P4.

In one embodiment, the encapsulation material is a thermoset epoxy resin mixture and may be loaded under a pressure in the range of 500-2000 psi. Fill times when the encapsulation material is a thermo-set epoxy resin mixture are on the order of 3-10 seconds. The injection pressure and fill times are dependent upon the specific encapsulating material that is used.

As the encapsulation material fills the portion of the mold cavity formed by the first mold section 32, the portion 22 of the substrate 10 bends or flexes under the pressure exerted by the encapsulation material. The bending brings the second surface 20 into a sealing engagement with the second molding section 34. Thus, a seal is dynamically formed as a portion of the mold cavity formed by the first mold section 32 is filled. In low-pressure applications, it is anticipated that a force may be exerted to cause the bending to take place.

The encapsulation material may be chosen from a class consisting of epoxies (including thermo-set resins), silicones, SYCAR, polyimides, and polyurethanes. SYCAR encapsulation material are silicon-carbon thermo-set resins and radiation curable resins for the electronics industry. These encapsulation materials are suitable for use when encapsulating electronic components because they have low moisture permeability, high mobile ions barriers, good UV-VIS and alpha particle protection, favorable mechanical, electrical and physical properties, as well as a low dielectric constant to reduce the device propagation delay and high thermal conductivity to dissipate heat generated by the devices. The proper choice of encapsulation material can enhance reliability of the device and improve its mechanical and physical properties. An optional curing step may hereinafter be required, depending upon the choice of encapsulation material, followed by removal of the mold sections 32, 34.

Figure 7:
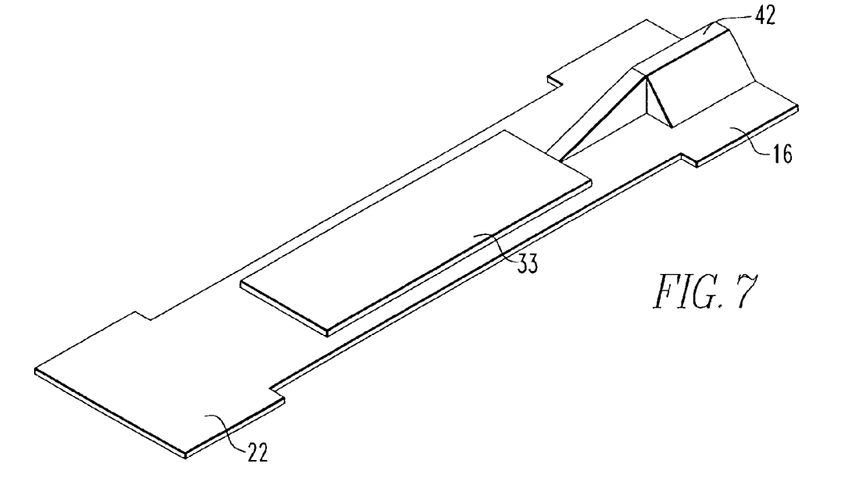
FIGS. 7 and 8 are perspective and plan views, respectively, of a first side of the portion of the substrate illustrated in FIGS. 2 and 3, after encapsulation.
Figure 8:
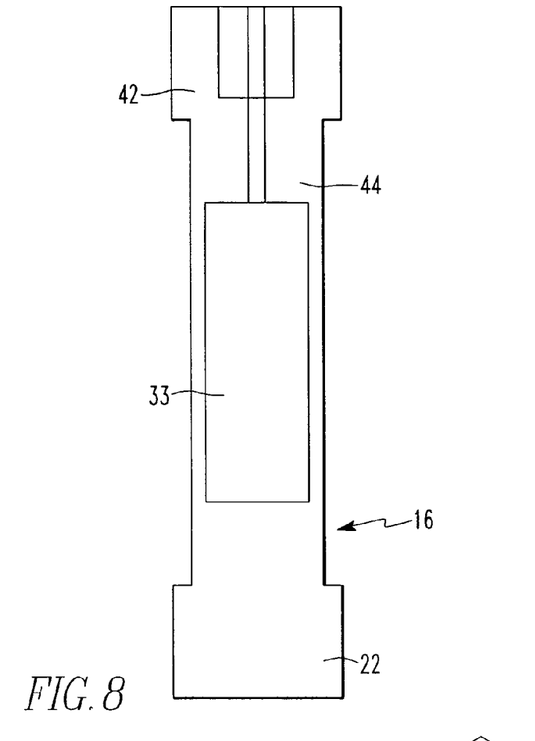
Figure 9:
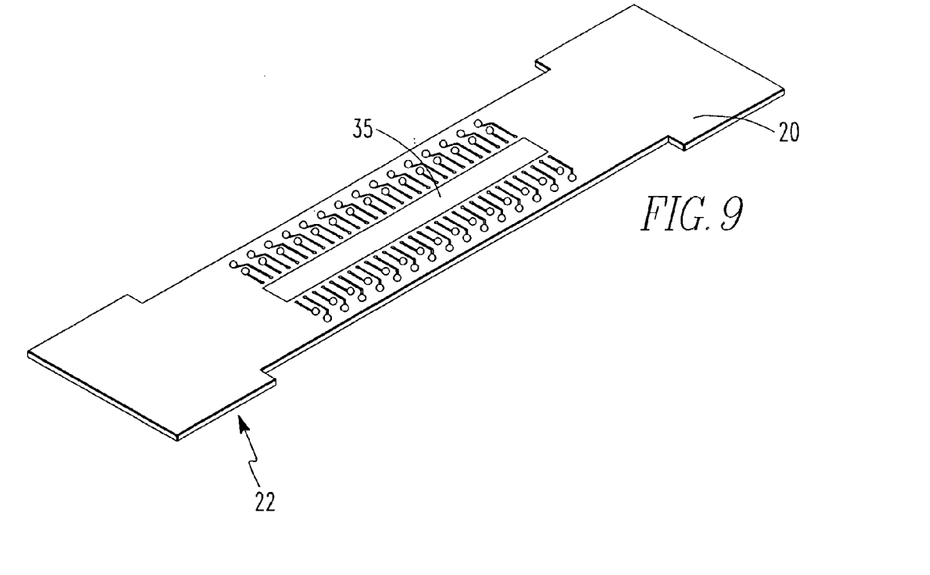
FIGS. 9 and 10 are perspective and plan views, respectively, of a second side of the portion of the substrate illustrated in FIGS. 2 and 3, after encapsulation.
Figure 10:
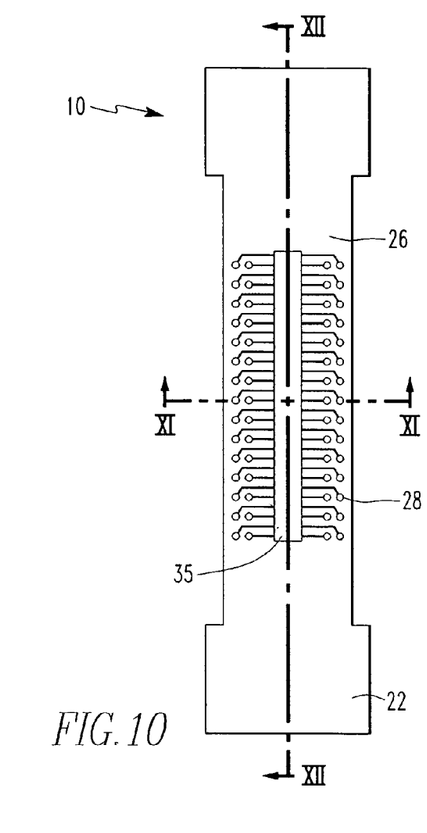

After the mold sections 32, 34 are removed, the encapsulated electronic device appears as shown in FIGS. 7, 8, 9, and 10. FIGS. 7 and 8 show the first side 16 of portion 22 after removal of mold section 32. A first portion of encapsulated material 33 is formed as a result of the encapsulation material being loaded into mold section 32. FIGS. 9 and 10 show the second side 20 of portion 22 after removal of mold section 34. A second portion of encapsulated material 35 is formed as a result of the encapsulation material being loaded into mold section 34.

Figure 11:
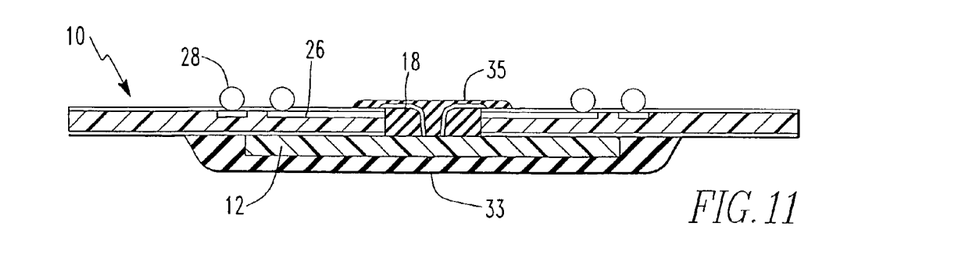
FIGS. 11 and 12 are views taken along the lines XI and XII, respectively, in FIG. 10.
Figure 12:
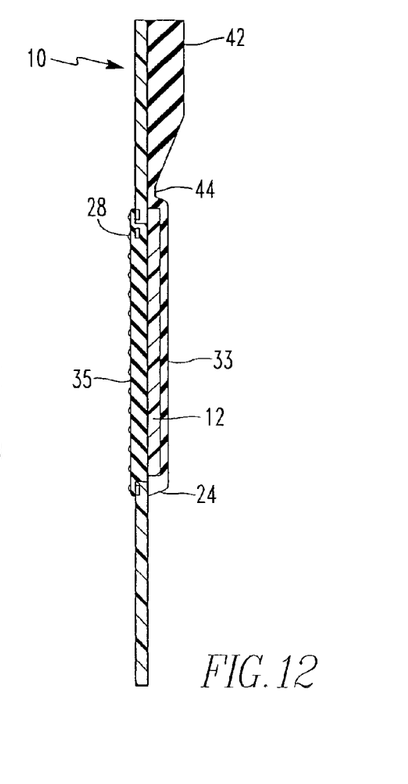

FIGS. 11 and 12 illustrate views taken along the lines XI and XII, respectively, in FIG. 10. FIG. 12 provides a view of runner 42 and primary gate 44, which is the mechanism for injecting the encapsulation material into the portion of the mold cavity formed by the first mold section 32.

Figure 13A:
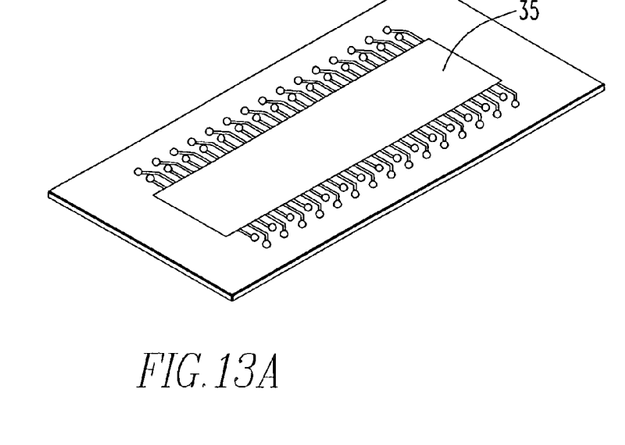
FIGS. 13A and 13B illustrate an asymmetric encapsulated device.
Figures 13B, 14:
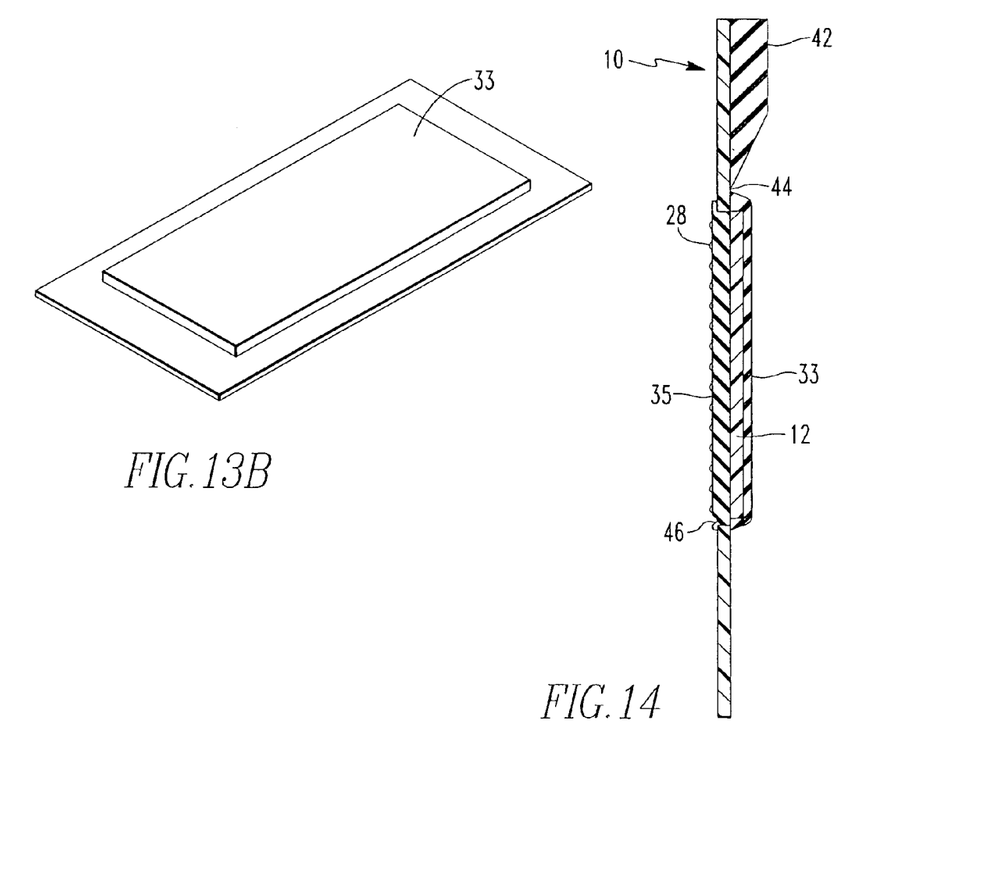
FIG. 14 illustrates another gate arrangement which may be used with a method of the present invention.

FIGS. 13A and 13B show the final product of the present invention after singulation, i.e. after portions of the substrate 22 are separated and the runner 42 is removed.

FIG. 14 shows another gate arrangement which may be used with the method of the present invention. The electrical device to be encapsulated is a memory device identical to the one as shown in previous FIGS. 1 through 13B, although the electrical device may be any type of device. The electrical device 12 is positioned such that opening 14 (see FIG. 1) is completely blocked. Thus encapsulating material injected into first mold section 32 from runner 42 and primary gate 44 is contained within first mold section 32. That is, there is no connecting gate between first mold section 32 and second mold section 34 through which encapsulation material may flow. Encapsulating material may be injected directly into mold section 34 through a gate 46 and a runner, not shown. The encapsulating material injected into mold section 34 is contained within mold section 34.

Figures 15, 16:
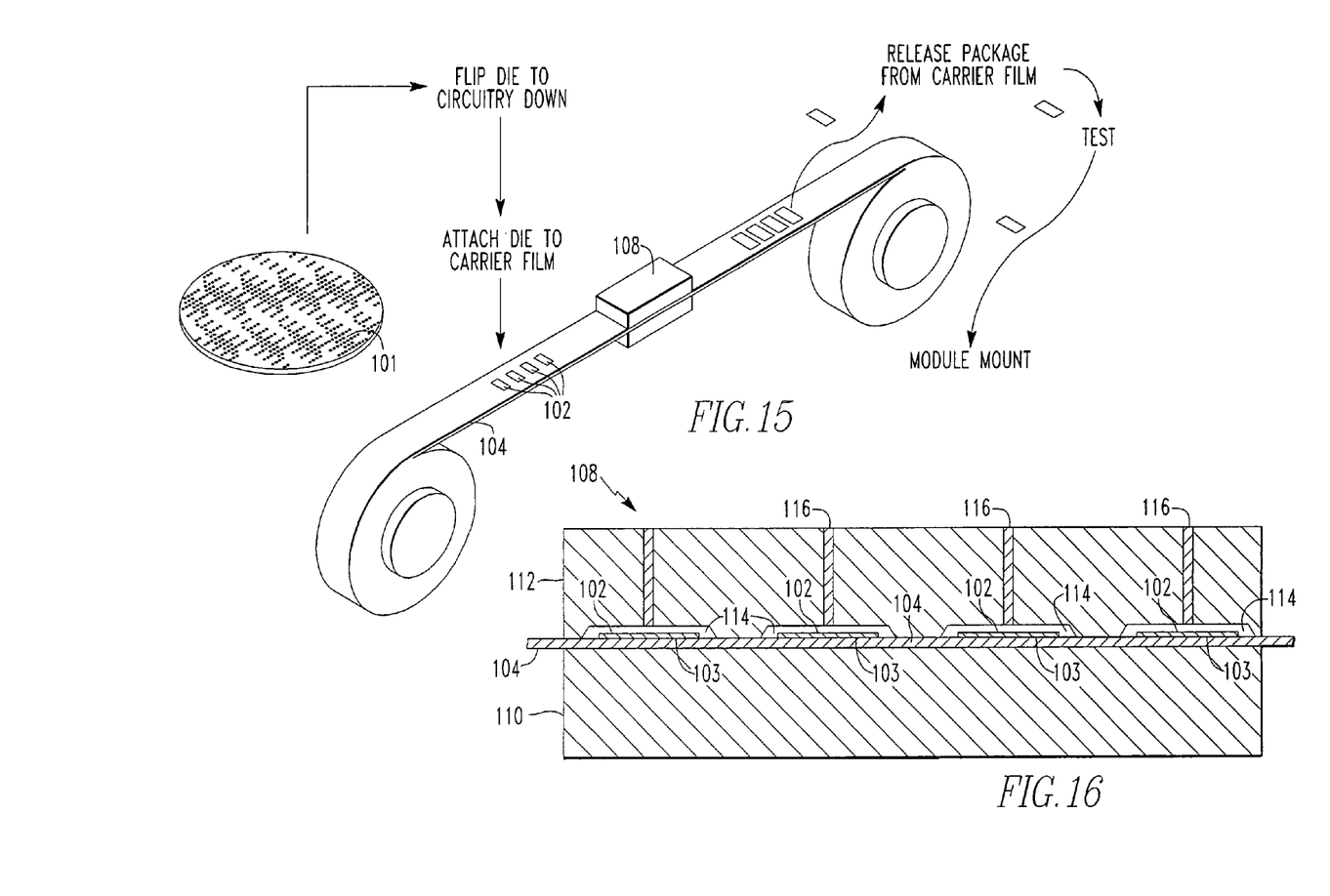
FIG. 15 illustrates a system which may be used to practice one embodiment of the present invention.
FIG. 16 illustrates a cross sectional view of the mold, carrier and die during an overmolding process of the present invention.

FIG. 15 illustrates a system which may be used to practice one embodiment of the present invention. Wafer 101, upon dicing, produces a plurality of singulated die 102. The present invention allows for the overmolding encapsulation of singulated die 102, having no frame or substrate. Overmolding is a process of encapsulating at least the side of die 102 opposite the side carrying the bonding pads leaving the side of the die carrying the bonding pads exposed for bonding or board mounting. The singulated die 102 may be encapsulated with an epoxy resin to create a standard size, and to adhere a protective shell onto die 102. This protects die 102 during handling processes. The present invention provides a standard package foot print, not affected by die shrinkage.

As stated, singulated die 102 will be overmolded, that is, encapsulated at least on the side of the die which does not contain the bonding pads using the method of the present invention. While four singulated die are shown in FIG. 15, the reader will understand that a plurality of die may be encapsulated at the same time. For example, a number of rows of any number of die each may be encapsulated simultaneously.

Further, the description of the method of the present invention in connection with the die is for purposes of illustration only, and not for limitation. It is anticipated that the method of the present invention may be used to overmold a large variety of articles.

Die 102 may be applied to carrier 104 by any known means, e.g. lamination, adhesion, etc. Carrier 104 is a temporary carrier which is used during the overmolding process of the present invention, and is not a component of the overmolded encapsulation made therefrom. Carrier 104 may be a carrier film which can be either a continuous roll or, as shown in FIG. 15, a strip configuration. Die 102 is attached to carrier film 104 such that the bonding pads of die 102 are "face down" on carrier 104. That will usually, but not necessarily, mean that the circuitry of the die 102 is face down on carrier 104. Carrier 104 serves to protect the bond pads of die 102. The bond pads of die 102 may comprise, for example, solder balls or bumps constructed according to techniques well known in the art. Carrier film 104 protects the bond pads of die 102 from being contaminated through resin bleed during the overmolding process.

Once the die 102 are placed on carrier 104, they are transported by carrier 104 to mold 108. After die 102 and carrier 104 are located within mold 108, the carrier is stopped, mold 108 is closed, and a clamping force is exerted by mold 108 to create a seal between carrier film 104 and mold 108. The encapsulation step occurs while the die are inside of mold 108 and after the seal between carrier film 104 and mold 108 is created, so that mold 108 provides an overmolding of that portion of the surface of die 102 which is not in direct contact with carrier 104. After overmolding, the pressure is released, the mold 108 is opened, and die 102 are transported out of mold 108 for removal from carrier 104. Die 102 are then tested and, if suitable, may be used in assembly processes such as module mounting. If necessary, and as described further herein below, an underfill process may be necessary to seal the package. Known standard underfilling processes and materials may be used. Examples of underfill epoxy encapsulants which may be used are bis-phenol type epoxy and cycloaliphatic epoxy to name a few. The most desired features of underfill materials are low viscosity (which can increase throughput), low curing temperature/fast curing time (which can reduce cost and be less harmful to other components), low thermal coefficient of expansion, high modulus (which leads to good mechanical properties), and low moisture absorption.

FIG. 16 provides a cross sectional view of mold 108, carrier 104 and die 102 during the overmolding process of the present invention. Mold 108 comprises first molding section 110 and second molding section 112 which are positioned around carrier 104 and die 102. Molding section 110 is a flat molding section and is in direct contact with carrier 104. Molding section 112 comprises a number of cavities 114. Cavities 114 are configured to receive die 102 and a portion of carrier 104. In one embodiment of the present invention, mold 108 is designed to apply force to carrier 104 and, when cavities 114 are filled, to apply force to die 102 such that a seal is created between section 112 and carrier 104 and carrier 104 and the side 103 of die 102 in contact with the carrier 104, respectively. The force which must be exerted by mold 108 to create a seal between carrier film 104 and die 102 is related to the thickness of carrier 104, the type of material of which carrier 104 is produced, the encapsulation material which is used to overmold die 102 and the injection pressure of the encapsulation material. The force exerted by the mold 108 to create a seal between carrier film 104 and die 102 will ordinarily be much larger than any force exerted by any adhesive material on carrier 104.

In one embodiment of the present invention, encapsulation material is injected through openings 116 into the cavities 114 of molding sections 112 to encapsulate those portions of die 102 which are not inaccessible as a result of the seal with carrier 104. That is, encapsulation material is injected into cavities 114 through openings 116 to overmold die 102. The seal which is created between the connection side 103 of die 102 and carrier 104 as the encapsulation material is injected prevents migration of the encapsulation material onto the side 103 of die 102 thereby preventing resin bleed.

The encapsulation material may be chosen from a class consisting of epoxies (including thermo-set resins), silicones, SYCAR, polyimides, and polyurethanes. SYCAR encapsulation material are silicon-carbon thermo-set resins and radiation curable resins for the electronics industry. These encapsulation materials are suitable for use when encapsulating electronic components because they have low moisture permeability, high mobile ion barriers, good UV-VIS and alpha particle protection, favorable mechanical, electrical and physical properties, as well as a low dielectric constant to reduce the device propagation delay and high thermal conductivity to dissipate heat generated by the devices. The proper choice of encapsulation material can enhance reliability of the device and improve its mechanical and physical properties. An optional curing step may hereinafter be required, depending upon the choice of encapsulation material, followed by opening of mold 108.

Figures 17, 18A, 18B:
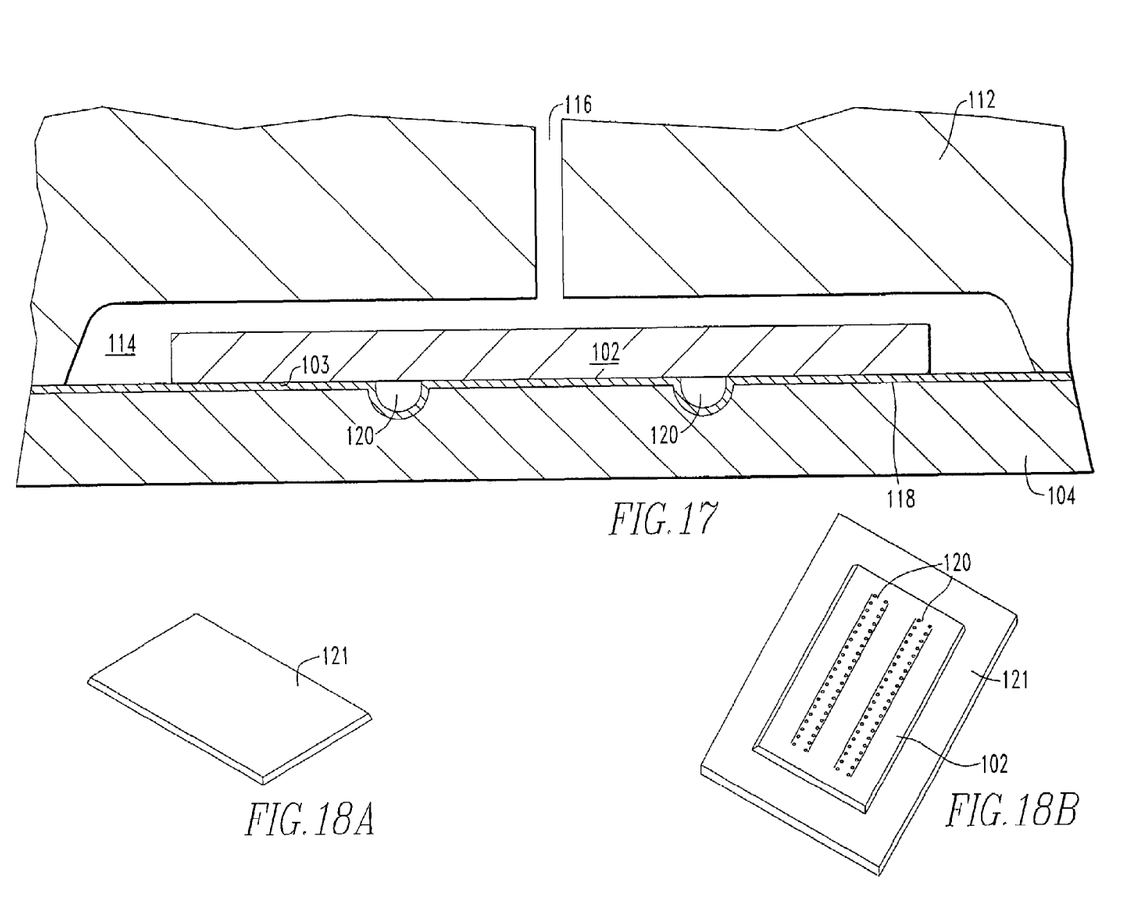
FIG. 17 illustrates a close-up of the relationship between one of the cavities of the mold of FIG. 16 with respect to an item being overmolded and the carrier.
FIGS. 18A and 18B illustrate a bumped die after overmolding by the process of the present invention using the mold of FIG. 17.

FIG. 17 is a close up of a portion of the upper die section 112 having die cavity 114 serviced by opening 116. As previously mentioned, die 102 may be applied to carrier 104 by any known means, e.g. lamination, adhesion, etc. FIG. 17 shows die 102 attached to carrier 104 by a layer of gasket forming adhesive 118 which is applied to the surface of carrier 104. Gasket forming adhesive 118 may be applied to the surface of carrier 104 or may be one of the ingredients which comprise carrier 104.

Shown in FIG. 17 is a type of die connection referred to as "bumped". That is, connection between the die and the outside world occurs through the balls or bumps forming the bonding pads. Carrier 104 may configured to be approximately three times as thick as the height of bumps 120. In one embodiment of the present invention, the height of the bumps 120 is 0.1 mm and the thickness of carrier 104 is 0.3 mm.

Because carrier 104 is approximately three times as thick as the height of the bumps 120, when force is applied to this configuration, carrier 104 absorbs bumps 120 and thus creates a seal to prevent the encapsulation material from bleeding between carrier 104 and the connection side 103 of die 102. Carrier 104 may also be a die boat of rigid material or constructed of a rolled material.

As shown in FIG. 18A, when cavity 114 is filled, a body 121 having the shape of cavity 114 is attached directly onto die 102 while leaving connection side 103 of die 102 (see FIG. 18B) exposed for bonding or board mounting. The side 103 is exposed as a result of the encapsulation material being prevented from reaching underside 103. Under such circumstances, an underfill process is needed to completely seal the package.

Figure 19:
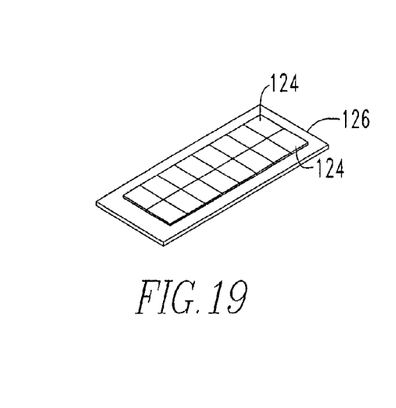
FIG. 19 illustrates a plurality of overmolded dies mounted on a board or substrate.

An example of a known underfill application comprises dispensing the underfill material through a syringe with a version system (to locate the edges of the die) and a pumping system (to control the amount of underfill material). After the underfill material is dispensed on either one side or two adjacent sides, the underfill material flows to completely cover the exposed portion of the die. The underfill material is then cured to completely seal the package. After underfilling, the resulting encapsulated device 124 (FIG. 19) is ready for mounting. FIG. 19 illustrates a plurality of encapsulated devices 124 mounted on a substrate 126.

Figure 20:
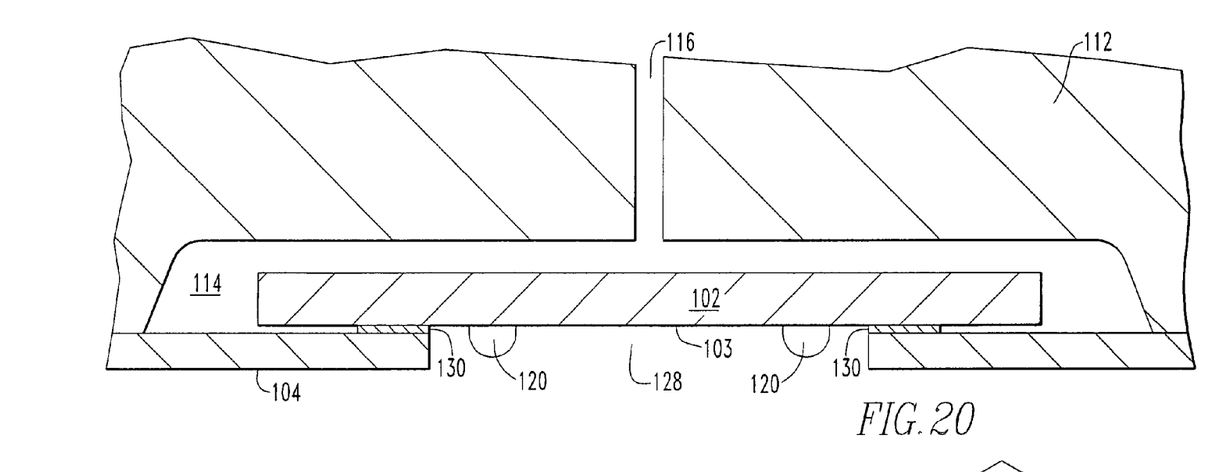
FIG. 20 illustrates another embodiment for a carrier.

Another embodiment of the present invention shown in FIG. 20 differs from the first embodiment in two ways. First, carrier 104 may have gaps or cavities 128 configured therein, which cavities 128 receive the bumps 120 of die 102. Carrier 104 is in contact with a portion of the connection side 103 of die 102 via seal 130. Seal 130 prevents resin bleed into cavities 125 and thus onto bumps 120. Note that seal 130 is positioned such that encapsulation material can reach at least a portion of side 103 of die 102. That permits encapsulation of a portion of side 103 and eliminates the need for an underfill step. However, the area of the die 102 exposed to the encapsulation material must be controlled such that the downward pressure exerted by the mold and encapsulation material exceeds the upward pressure exerted by the encapsulation between the carrier 104 and side 103. Also, the encapsulation material must have flow characteristics that permit the material to flow in the space between carrier 104 and side 103 without disrupting the seal created by seal 130. Those of ordinary skill in the art will recognize that the differences between the embodiment of FIG. 17 and the embodiment of FIG. 20 can be used either individually or in combination, as shown in FIG. 20.

Figure 21:
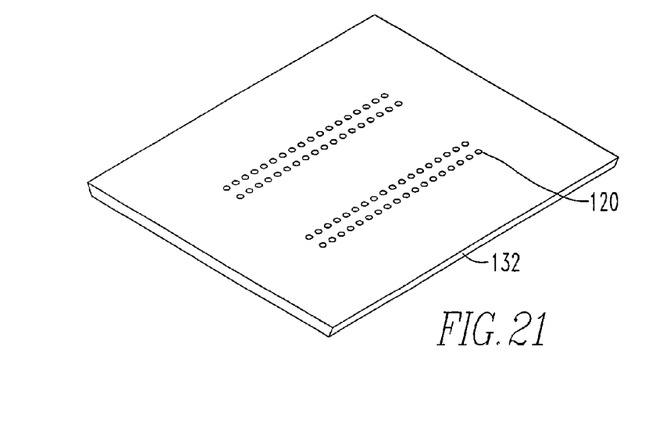
FIG. 21 illustrates an encapsulated die formed using the carrier of FIG. 20.

FIG. 21 illustrates a bumped die 132 after overmolding by the process of the present invention as illustrated in FIG. 20. Bumped die 132 is completely encapsulated except for bumps 120 which are exposed for module mounting. No encapsulation material is present on side 103 in the area of the bumps 120 because of the position of the seal 130.

The present invention allows for a single die to be encapsulated with an epoxy resin to create a standard size overmolded die. The epoxy resin serves as a protective shell to the die. The resulting CSP is an important packaging type in the electronic packaging industry. The present invention provides for the advantages of a CSP because of standardization in size but still enables the chip to be used in processes in which chips are mounted directly onto boards.

While the present invention has been described in conjunction with preferred embodiments thereof, those of ordinary skill will recognize that many modifications and variations thereof are possible. It is anticipated that the method of the present invention may be carried out using a variety of encapsulating materials and commercially available injection molding machines as well as a variety of underfill materials and applications. Also, the carrier may be comprised of a variety of materials. The foregoing description and following claims are intended to cover all such modifications and variations.

What is claimed is:

1. A method of encapsulating an article having opposing first and second sides, comprising:
    positioning the article on a temporary carrier such that at least a portion of the first side contacts the temporary carrier in a manner to prohibit the flow of any encapsulating material between the temporary carrier and the first side of the article;
    positioning a portion of the temporary carrier carrying the article within a mold;
    forming a seal between the mold and the temporary carrier;
    filling the mold with an encapsulating material in a manner so as to cover at least the second side;
    removing the portion of the temporary carrier carrying the article from the mold;
    separating the article from the temporary carrier; and underfilling the first side of the article with an underfill material.

2. The method of claim 1 wherein said temporary carrier is comprised of polymeric core material overlaid with an adhesive material.

3. The method of claim 1 wherein said step of filling the mold includes the step of filling the mold with an encapsulating material chosen from a class consisting of epoxies, including thermo-set resins, silicones, silicon-carbon thermo-set resins, radiation curable resins, polyimides, and polyurethanes.

4. The method of claim 3 including the step of curing the encapsulating material.

5. The method of claim 1 wherein the step of underfilling includes the step of underfilling the first side of the article with an epoxy resin.

6. The method of claim 5 including the step of curing the epoxy resin.

7. The method of claim 1 wherein the temporary carrier is further defined as having gaps and wherein said positioning the article includes positioning the article such that at least a portion of the article is located on a gap.

8. A method of encapsulating an article having opposing first and second sides, comprising:
    positioning the article on a temporary carrier such that the first side is supported by the temporary carrier to allow the flow of encapsulating material between a portion of the temporary carrier and a portion of the first side of the article;
    positioning a portion of the temporary carrier carrying the article within a mold;
    forming a seal between the mold and the temporary carrier;
    filling the mold with an encapsulating material in a manner so as to cover the second side and a portion of the first side;
    removing the portion of the temporary carrier carrying the article from the mold; and
    separating the article from the temporary carrier.

9. The method of claim 8 wherein the filling step forms a seal between the article and the carrier as the pressure exerted by the encapsulating material onto the second side of the article as the encapsulating material fills the mold exceeds the pressure exerted by the encapsulating material onto the first side of the article.

10. A method of encapsulating an article having opposing first and second sides, comprising:
    positioning the article on a temporary carrier such that at least a portion of the first side contacts the temporary carrier in a manner to prohibit the flow of any encapsulating material between the temporary carrier and the first side of the article;
    positioning a portion of the temporary carrier carrying the article within a mold;
    forming a seal between the mold and the temporary carrier using clamping pressure;
    dynamically forming a seal between the article and the temporary carrier by injecting an encapsulating material into the mold onto the second side of the article;
    removing the portion of the temporary carrier carrying the article from the mold;
    separating the article from the temporary carrier; and
    underfilling the first side of the article with an underfill material.

11. The method of claim 10 wherein said temporary carrier is comprised of polymeric core material overlaid with an adhesive material.

12. The method of claim 10 wherein said step of dynamically forming a seal includes the step of injecting into the mold an encapsulating material chosen from a class consisting of epoxies, including thermo-set resins, silicones, silicon-carbon thermo-set resins, radiation curable resins, polyimides, and polyurethanes.

13. The method of claim 12 including the step of curing the encapsulating material.

14. The method of claim 10 wherein the step of underfilling includes the step of underfilling the first side of the article with an epoxy resin.

15. The method of claim 14 including the step of curing the epoxy resin.

16. The method of claim 10 wherein the temporary carrier is further defined as having gaps and wherein said positioning the article includes positioning the article such that at least a portion of the article is located on a gap.

17. A method of encapsulating an article having opposing first and second sides, comprising:
    positioning the article on a temporary carrier such that the first side is supported by the temporary carrier to allow the flow of encapsulating material between the temporary carrier and a portion of the first side of the article;
    positioning a portion of the temporary carrier carrying the article within a mold;
    forming a seal between the mold and the temporary carrier using clamping pressure;
    dynamically forming a seal between the article and the temporary carrier by injecting an encapsulating material into the mold onto the second side of the article;
    removing the portion of the temporary carrier carrying the article from the mold; and
    separating the article from the temporary carrier.

18. The method of claim 17 wherein the dynamically forming a seal step results as the pressure exerted by the encapsulating material onto the second side of the article as the encapsulating material fills the mold is greater than the pressure exerted by the encapsulating material onto the first side of the article.

* * * * *

UNITED STATES PATENT AND TRADEMARK OFFICE
CERTIFICATE OF CORRECTION

PATENT NO.         : 7,655,508 B2                              Page 1 of 1
APPLICATION NO.    : 10/894675
DATED              : February 2, 2010
INVENTOR(S)        : Johnson et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1100 days.

Signed and Sealed this

Twenty-third Day of November, 2010

David J. Kappos
*Director of the United States Patent and Trademark Office*